(12) United States Patent
Hattori et al.

(10) Patent No.: US 9,560,764 B2
(45) Date of Patent: *Jan. 31, 2017

(54) CHIP-COMPONENT STRUCTURE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/737,731

(22) Filed: Jun. 12, 2015

(65) Prior Publication Data

US 2015/0282326 A1    Oct. 1, 2015

Related U.S. Application Data

(63) Continuation of application No. 13/906,695, filed on May 31, 2013, now Pat. No. 9,089,054.

(30) Foreign Application Priority Data

Jun. 12, 2012 (JP) .................................. 2012-132793

(51) Int. Cl.
*H05K 7/00* (2006.01)
*H05K 1/11* (2006.01)
(Continued)

(52) U.S. Cl.
CPC .............. *H05K 1/181* (2013.01); *H01G 4/232* (2013.01); *H01G 4/30* (2013.01); *H01G 4/35* (2013.01); *H05K 1/0216* (2013.01); *H05K 1/141* (2013.01); *H05K 3/1258* (2013.01); *H05K 3/341* (2013.01); *H05K 3/3442* (2013.01); *H05K 2201/049* (2013.01); *H05K 2201/09036* (2013.01); *H05K 2201/09072* (2013.01); *H05K 2201/09181* (2013.01); *H05K 2201/10015* (2013.01); *H05K 2201/10378* (2013.01); *H05K 2201/10636* (2013.01); *H05K 2201/10962* (2013.01); *H05K 2201/10984* (2013.01);
(Continued)

(58) Field of Classification Search
CPC .... H05K 1/0216; H05K 1/181; H05K 3/1258; H05K 3/341; H05K 2201/10984; H05K 2201/10015; H05K 2201/10378; H05K 2201/10636; H05K 2201/10962; H05K 2201/09036

See application file for complete search history.

(56) References Cited

U.S. PATENT DOCUMENTS 6,509,350 B2 * 1/2003 Vivilecchia .......... A61K 9/2009
514/307

OTHER PUBLICATIONS

Hattori et al., "Chip-Component Structure", U.S. Appl. No. 13/906,695, filed May 31, 2013.

* cited by examiner

*Primary Examiner* — Hoa C Nguyen
(74) *Attorney, Agent, or Firm* — Keating & Bennett, LLP

(57) ABSTRACT

A chip-component structure includes an interposer on which a multilayer capacitor is mounted. The interposer includes component connecting electrodes, external connection electrodes, side electrodes, and in-hole electrodes. The component connecting electrodes and the external connection electrodes are electrically connected by the side electrodes and the in-hole electrodes. Outer electrodes of the capacitor are joined to the component connecting electrodes.

17 Claims, 11 Drawing Sheets

(51) Int. Cl.
   *H05K 1/16*    (2006.01)
   *H05K 1/18*    (2006.01)
   *H05K 1/02*    (2006.01)
   *H05K 3/12*    (2006.01)
   *H05K 3/34*    (2006.01)
   *H01G 4/30*    (2006.01)
   *H01G 4/232*   (2006.01)
   *H05K 1/14*    (2006.01)
   *H01G 4/35*    (2006.01)

(52) U.S. Cl.
   CPC ..... *H05K 2201/2045* (2013.01); *Y02P 70/611* (2015.11); *Y02P 70/613* (2015.11)

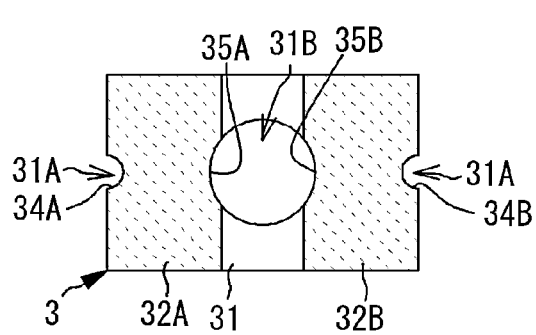
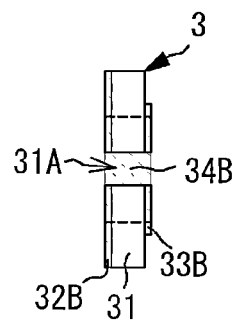
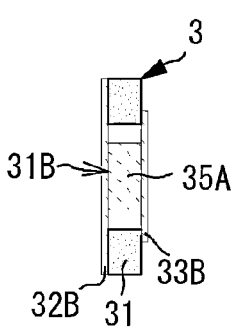
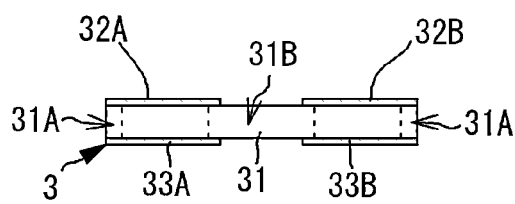
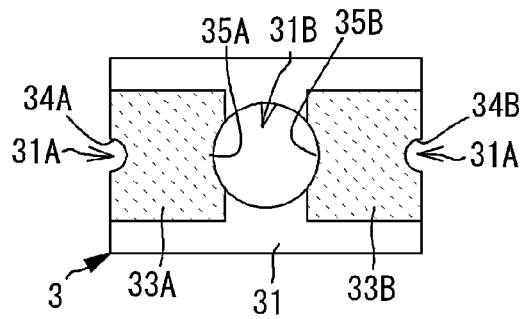
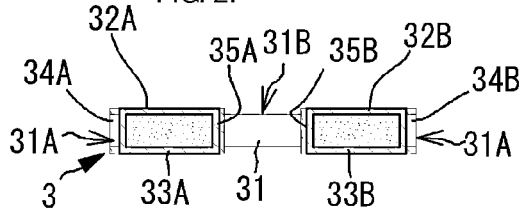

CHIP-COMPONENT STRUCTURE

BACKGROUND OF THE INVENTION

1. Field of the Invention

The present invention relates to a chip-component structure including a multilayer capacitor and an interposer to be mounted on a circuit board with the capacitor being disposed thereon.

2. Description of the Related Art

Currently, chip components, especially, small multilayer capacitors are frequently used in circuit boards of mobile terminals such as cellular phones. A typical multilayer capacitor includes a laminated body shaped like a substantially rectangular parallelepiped in which internal electrodes are provided between a plurality of dielectric layers, and outer electrodes provided on end surfaces of the laminated body opposite to each other in a longitudinal direction.

In general, the multilayer capacitor is electrically and physically connected to a circuit board by placing the outer electrodes on mounting lands of the circuit board and joining the mounting lands and the outer electrodes with a joining material such as solder (for example, see Japanese Unexamined Patent Application Publication No. 8-55752).

In such a multilayer capacitor, small mechanical distortions are sometimes caused by the application of voltage. When the distortions are transmitted to the circuit board, acoustic noise is produced by the circuit board. To address this problem, the capacitor is sometimes mounted on the circuit board with another member being disposed therebetween (for example, see Japanese Unexamined Patent Application Publication Nos. 2004-134430 and 2010-123614). An interposer or a conductive support member is used, for example, as the member to be disposed between the capacitor and the circuit board.

An interposer is a substrate including an upper electrode to which the outer electrodes of the multilayer capacitor are joined, a lower electrode to be joined to the mounting lands of the circuit board, and side electrodes provided on end surfaces of the interposer to connect the upper electrode and the lower electrode.

A conductive support member includes a pair of support legs to be joined at lower ends to the mounting lands of the circuit board, and the support legs clamp and support the multilayer capacitor in the air.

In general, there is a demand that the multilayer capacitor has a low equivalent series inductance (ESL). However, when the multilayer capacitor is mounted on a circuit board with the interposer being disposed therebetween, a current path is extended by wiring provided in the interposer, and this increases ESL.

To reduce ESL increased by the wiring in the interposer, it is effective to increase the cross-sectional area of the wiring by increasing the width of side electrodes. However, if the width of the side electrodes is increased, the amount of joining material that wets and spreads upward on the side electrodes increases, and the joining material easily reaches outer electrodes of the capacitor. Consequently, distortion of the capacitor is likely to be transmitted to the circuit board via the joining material such that acoustic noise is likely to be produced from the circuit board.

SUMMARY OF THE INVENTION

Preferred embodiments of the present invention provide a chip-component structure that significantly reduces ESL while also significantly reducing or preventing acoustic noise produced from a circuit board even when an interposer is used to mount a multilayer capacitor on the circuit board.

A preferred embodiment of the present invention includes a chip-component structure in which a multilayer capacitor is provided on an interposer. The multilayer capacitor includes a laminated body and outer electrodes. The laminated body preferably has a rectangular or substantially rectangular parallelepiped shape in which a plurality of dielectric layers and a plurality of internal electrodes are stacked. The outer electrodes are provided on opposite longitudinal component end surfaces of the laminated body, and are electrically connected to the different internal electrodes. The interposer includes a substrate body, a component connecting electrode, an external connection electrode, and in-hole electrodes. The substrate body includes a through-hole opened between both principal surfaces thereof. The component connecting electrode is provided on a component mount surface serving as one of the principal surfaces of the interposer and is joined to the outer electrodes. The external connection electrode is provided on a substrate mount surface serving as the other principal surface of the interposer opposite to the component mount surface. The in-hole electrodes are provided in the through-hole to connect the component connecting electrode and the external connection electrode. In such a structure, the in-hole electrodes connected to the different outer electrodes of the multilayer capacitor are provided in the same through-hole.

In this structure, since the component connecting electrode and the external connection electrode are connected by the in-hole electrodes provided in the through-hole of the interposer, the amount of solder that reaches the outer electrodes of the multilayer capacitor can be reduced.

When the in-hole electrodes connected to the different outer electrodes of the multilayer capacitor are provided in the same through-hole, loop planes of magnetic fields produced in the interposer by the in-hole electrodes are aligned with each other with respect to the through-hole. Further, currents in the in-hole electrodes flow in opposite directions, and the magnetic fields cancel each other out. Therefore, the inductance of the in-hole electrodes is reduced.

In the above chip-component structure, side electrodes directly connected to the external connection electrode and the component connecting electrode may be provided on substrate end surfaces of the substrate body intersecting the component mount surface and the substrate mount surface.

In this structure, since the side electrodes are directly connected to the component connecting electrode, the side electrodes and the in-hole electrodes are connected in parallel between the component connecting electrode and the external connection electrode. Therefore, current paths are dispersed, and the total ESL of the chip-component structure is significantly reduced.

Preferably, in the interposer of the chip-component structure, the substrate end surfaces on which the side electrodes are provided are located in outer side portions of the component end surfaces of the laminated body parallel or substantially parallel to the substrate end surfaces.

Preferably, the side electrodes in the above chip-component structure are provided in grooves that extend from the substrate end surfaces to portions overlapping with the multilayer capacitor, as viewed in a direction normal or substantially normal to the principal surfaces.

In these structures, it is possible to reduce the amount of joining material that wets and spreads upward on the side electrodes of the interposer and reaches the outer electrodes of the multilayer capacitor, and to significantly reduce or prevent production of audible sound in the circuit board.

The above chip-component structure may include, on the substrate end surfaces, side electrodes provided apart from the component connecting electrode and the outer electrodes and directly connected to the external connection electrode.

In this structure, since the side electrodes are apart from the component connecting electrode and the outer electrodes, solder that wets and spreads on the side electrodes is unlikely to reach the component connecting electrode and the outer electrodes of the multilayer capacitor. Thus, production of audible sound in the circuit board is significantly reduced and prevented.

Preferably, the through-hole of the above chip-component structure communicates between spaces opposed to the principal surfaces of the substrate body.

Flux and a joining material are provided on mounting lands of a circuit board, the chip-component structure is placed thereon, and the joining material is solidified, so that the chip-component structure is mounted on the circuit board. After mounting, flux residues may remain around the solidified joining material and may corrode peripheral electrodes. For this reason, it is necessary to clean off the flux residues after mounting. However, when the flux residues remain in a gap between the circuit board and the interposer, they are difficult to sufficiently clean off. Accordingly, when the through-hole provided in the interposer communicate between the spaces opposed to both principal surfaces, air and cleaning liquid easily come out from the gap between the circuit board and the interposer, and the remaining flux residues can be cleaned off more effectively.

Another preferred embodiment of the present invention relates to a chip-component structure in which a multilayer capacitor is provided on an interposer. The interposer includes a substrate body, a component connecting electrode, an external connection electrode, a side electrode, and an in-hole electrode. The substrate body includes a through-hole opened between both principal surfaces. The component connecting electrode is provided on a component mount surface serving as one of the principal surfaces of the interposer, and is joined to an outer electrode. The external connection electrode is provided on a substrate mount surface serving as the other principal surface of the interposer opposite to the component mount surface. The side electrode is provided on a substrate end surface intersecting the component mount surface and the substrate mount surface of the interposer to electrically connect the component connecting electrode and the external connection electrode. The in-hole electrode is provided in the through-hole to connect the component connecting electrode and the outer electrode in parallel with the side electrode.

In this structure, the component connecting electrode and the external connection electrode are connected using the in-hole electrode provided in the through-hole of the interposer. Thus, a current path is ensured by the in-hole electrode and ESL is significantly reduced even when the line width of the side electrode is small. Further, since the line width of the side electrode is small, it is possible to reduce the amount of joining material that wets and spreads on the side electrode and to significantly reduce and prevent production of acoustic noise in the circuit board.

By using the chip-component structure according to the various preferred embodiments of the present invention, the amount of solder that reaches the outer electrode of the multilayer capacitor is significantly reduced and production of audible noise in the circuit board is significantly reduced and prevented. Further, magnetic fields produced in the interposer by the in-hole electrodes cancel each other, and current paths are dispersed by addition of the side lines. This reduces the inductances of the in-hole electrodes and the side lines, and greatly reduces ESL.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2F illustrate a structure of an interposer according to the first preferred embodiment of the present invention.

DETAILED DESCRIPTION OF THE PREFERRED EMBODIMENTS

First Preferred Embodiment

A chip-component structure 1 according to a first preferred embodiment of the present invention will be described below.

The chip-component structure 1 preferably includes a multilayer capacitor 2 and an interposer 3. Detailed structures of the multilayer capacitor 2 and the interposer 3 will be described below.

Figure 1A:
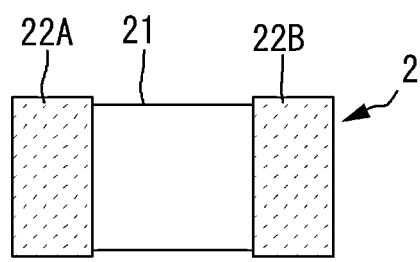
FIGS. 1A to 1C illustrate a structure of a multilayer capacitor according to a first preferred embodiment of the present invention.
Figure 1C:
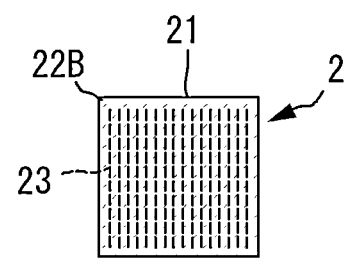
Figure 1B:
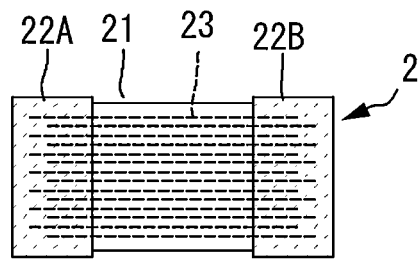

FIGS. 1A, 1B, and 1C are a plan view, a front view, and a right side view, respectively, of the capacitor 2.

The capacitor 2 preferably includes a laminated body 21, outer electrodes 22A and 22B, and inner electrodes 23. The laminated body 21 preferably is shaped like a rectangular or substantially rectangular parallelepiped including both longitudinal end surfaces (right and left side surfaces in FIGS. 1A to 1C) of a square or substantially square shape, and is defined by a plurality of dielectric layers stacked in a lateral direction. Also, in the laminated body 21, the inner electrodes 23 are stacked with the dielectric layers being disposed therebetween. The outer electrode 22A is preferably provided on a first end surface in a longitudinal direction (a left side surface in FIGS. 1A to 1C) of the laminated body 21 and on areas of four side surfaces of the laminated body 21 in the lateral direction (front, back, top, and bottom surfaces in FIGS. 1A to 1C) of the laminated body 21 in the lateral direction that extend for a constant distance from the first end surface. The outer electrode 22B is preferably provided on a second end surface in the longitudinal direction (a right side surface in FIGS. 1A to 1C) of the laminated body 21 and on areas of the four side surfaces of the laminated body 21 in the lateral direction that extend for a constant distance from the second end surface.

The outer electrodes 22A and 22B may be plated with a predetermined metal in consideration of corrosion resistance and conductivity. Preferably, the capacitor 2 has a popular standard outer size such as, for example, longitudinal and lateral dimensions of about 3.2 mm×about 1.6 mm, about 2.0 mm×about 1.25 mm, about 1.6 mm×about 0.8 mm, about 1.0 mm×about 0.5 mm, or about 0.6 mm×about 0.3 mm.

FIGS. 2A, 2B, and 2C are a plan view, a front view, and a right side view, respectively, of the interposer 3. FIGS. 2D, 2E, and 2F are a bottom view, a sectional side view, and a sectional front view, respectively, of the interposer 3.

The interposer 3 about includes a substrate body 31, component connecting electrodes 32A and 32B, external connection electrodes 33A and 33B, side electrodes 34A and 34B, and in-hole electrodes 35A and 35B.

The substrate body 31 is preferably made of insulating resin, and has a thickness of about 0.5 to about 1.0 mm in a principal-surface normal direction orthogonal or substantially orthogonal to a top surface (a component mount surface) and a bottom surface (substrate mount surface). The planar shape of the substrate body 31 is preferably rectangular or substantially rectangular, as viewed in the principal-surface normal direction.

The substrate body 31 preferably includes grooves 31A and a through-hole 31B. The grooves 31A are preferably provided in a first end surface and a second end surface (a left side surface and a right side surface in FIGS. 2A to 2F) serving as opposite end surfaces in the longitudinal direction. The grooves 31A preferably have a semi-arc planar shape or a substantially semi-arc planar shape, and extend in the principal-surface normal direction from the center of the substrate body 31 in a depth direction (a direction perpendicular or substantially perpendicular to a front surface and a back surface in FIGS. 2A to 2F). The through-hole 31B is preferably provided in a circular shape at the centers of both principal surfaces of substrate body 31, and penetrates through the principal surfaces.

The component connecting electrodes 32A and 32B are arranged on the top surface of the substrate body 31 in the longitudinal direction. The component connecting electrode 32A is provided in a rectangular or substantially rectangular area that has a width corresponding to the overall length of a boundary line between the top surface and the first end surface of the substrate body 31 and that extends for a constant distance from the boundary line. The component connecting electrode 32B is provided in a rectangular or substantially rectangular area that has a width corresponding to the overall length of a boundary line between the top surface and the second end surface of the substrate body 31 and that extends for a constant distance from the boundary line.

The component connecting electrodes 32A and 32B may have any desirable shape as long as they reach the through-hole 31B from the boundary lines between the top surface and the first and second end surfaces of the substrate body 31. For example, when the component connecting electrodes 32A and 32B have a planar shape that nearly coincides with the planar shape of the outer electrodes 22A and 22B of the capacitor 2, the capacitor 2 can be mounted on a desired position with high accuracy because of a so-called self-alignment effect.

The external connection electrodes 33A and 33B are arranged on the bottom surface of the substrate body 31 in the longitudinal direction. The external connection electrode 33A is provided in a rectangular or substantially rectangular area that extends for a constant distance from a boundary line between the bottom surface and the first end surface of the substrate body 31. The width of the external connection electrode 33A is smaller by fixed dimensions at both ends than the length of the boundary line. The external connection electrode 33B is provided in a rectangular or substantially rectangular area that extends for a constant distance from a boundary line between the bottom surface and the second end surface of the substrate body 31. The width of the external connection electrode 33B is smaller by fixed dimensions at both ends than the length of the boundary line.

The external connection electrodes 33A and 33B may have any desirable shape as long as they reach the through-hole 31B from the boundary lines between the bottom surface and the first and second end surfaces of the substrate body 31. For example, the shape of the external connection electrodes 33A and 33B can be set according to mounting lands on a circuit board on which the structure 1 is to be mounted.

The side electrodes 34A and 34B are preferably provided on arc-shaped or substantially arc-shaped side walls of the grooves 31A. The side electrode 34A ensures electrical continuity between the component connecting electrode 32A and the external connection electrode 33A. The side electrode 34B ensures electrical continuity between the component connecting electrode 32B and the external connection electrode 33B.

The in-hole electrodes 35A and 35B are provided on a side wall of the through-hole 31B. The in-hole electrode 35A is provided on a left portion of the side wall of the through-hole 31B to ensure electrical continuity between the component connecting electrode 32A and the external connection electrode 33A. The in-hole electrode 35B is provided on a right portion of the side wall of the through-hole 31B to ensure electrically continuity between the component connecting electrode 32B and the external connection electrode 33B.

Figure 3A:
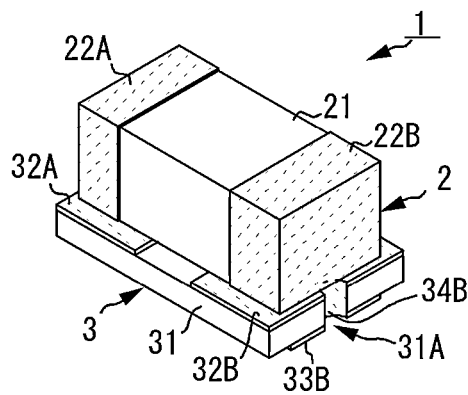
FIGS. 3A to 3F illustrate a structure of a chip-component structure according to the first preferred embodiment of the present invention.
Figure 3B:
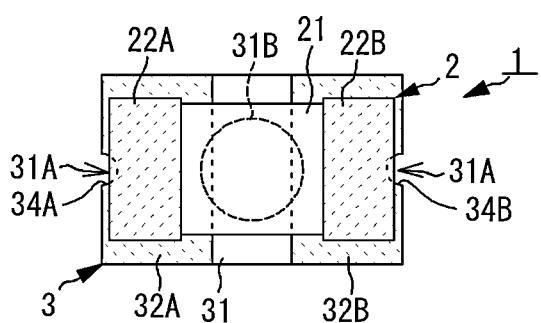
Figure 3D:
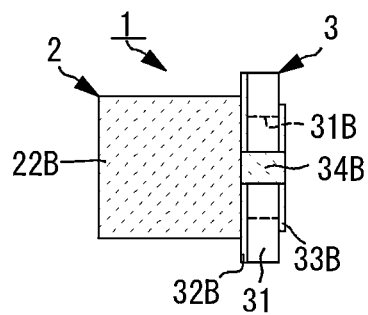
Figure 3C:
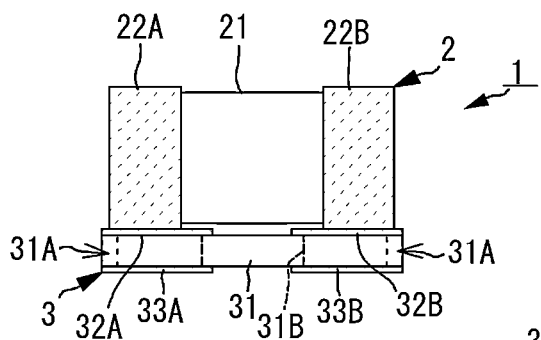
Figure 3F:
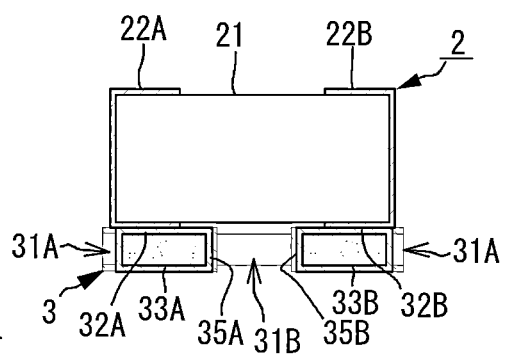
Figure 3E:
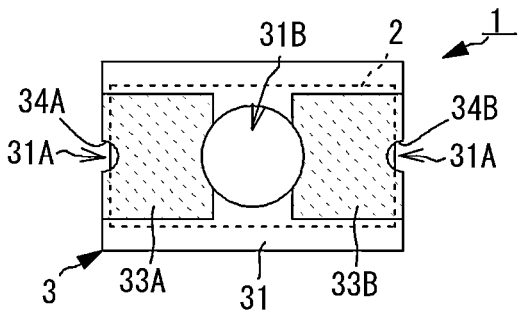

FIGS. 3A, 3B, and 3C are an external perspective view, a plan view, and a front view, respectively, of the structure 1. FIGS. 3D, 3E|, and 3F are a right side view, a bottom view, and a sectional front view, respectively, of the structure 1.

The chip-component structure 1 is defined by mounting the above-described capacitor 2 on the interposer 3. A surface of the capacitor 2 to be mounted on the interposer 3 may be any of the four side surfaces in the lateral direction (the front, back, top, and bottom surfaces described above). In the first preferred embodiment, the planar shape of the substrate body 31 is preferably slightly larger than the planar shape of the capacitor 2.

The capacitor 2 is mounted on the interposer 3 so that the outer electrodes 22A and 22B overlap with the grooves 31A, and the outer electrodes 22A and 22B are joined to the component connecting electrodes 32A and 32B, respectively. Thus, the outer electrodes 22A and 22B of the capacitor 2 are respectively connected to the external connection electrodes 33A and 33B via the component connecting electrodes 32A and 32B, the side electrodes 34A and 34B, and the in-hole electrodes 35A and 35B of the interposer 3.

The outer electrodes 22A and 22B and the component connecting electrodes 32A and 32B may be joined by any desirable method. For example, the outer electrodes 22A and 22B and the component connecting electrodes 32A and 32B can be joined by, for example, remelting a remeltable metal (e.g., tin) with which the electrodes are plated beforehand. By such a joining method, the outer electrodes 22A and 22B and the component connecting electrodes 32A and 32B can be electrically and mechanically connected by the remelted plating metal. Other joining methods may be used, and for example, the capacitor 2 and the interposer 3 may be joined with a joining material such as solder.

Figure 4A:
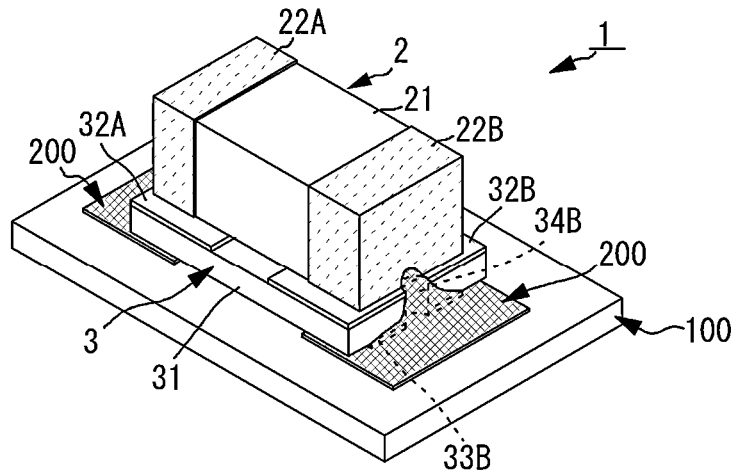
FIGS. 4A to 4C illustrate a mount state of the chip-component structure of the first preferred embodiment of the present invention.
Figure 4B:
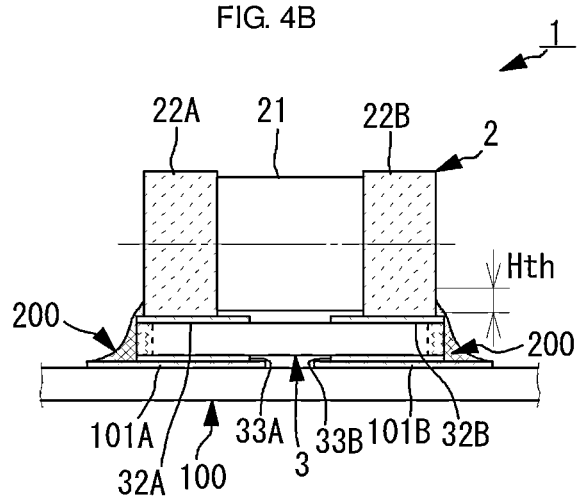
Figure 4C:
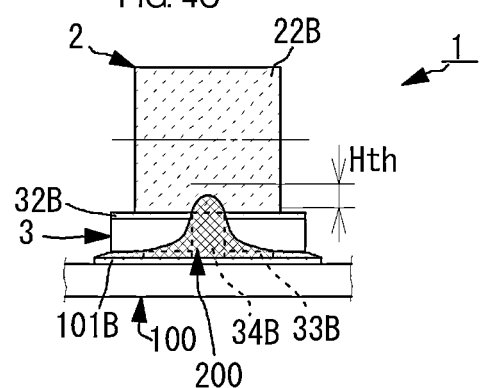

FIGS. 4A, 4B, and 4C are a perspective view, a front view, and a right side view, respectively, illustrating a state in which the structure 1 is mounted on a circuit board 100.

The structure 1 is preferably mounted on the circuit board 100 with solder 200 used as a joining material. The circuit board 100 preferably includes mounting lands 101A and 101B on which solder paste and flux, for example, are applied. The structure 1 is preferably mounted on the circuit board 100 by melting and solidifying the solder paste in a state in which the external connection electrodes 33A and 33B of the structure 1 are in contact with the mounting lands 101A and 101B, respectively. When the solder paste is melted and solidified, melted solder wets and spreads upward on the side electrodes 34A and 34B of the structure 1, and defines fillets.

The fillets of the solder 200 are arranged to extend at least from the mounting lands 101A and 101B to the side electrodes 34A and 34B. Therefore, the fillets can join the structure 1 and the circuit board 100 with a sufficient joint strength. Also, the fillets can preferably prevent the structure 1 from coming off the circuit board 100. Further, joint failure can be visually confirmed from the shape of the fillets. The joining material is not limited to the solder 200, and any joining material may be used as long as it has appropriate wettability and conductivity.

In the structure 1 thus configured, the cross-sectional area of wiring is made larger when the in-hole electrodes 35A and 35B are added than when only the side electrodes 34A and 34B are provided, and this reduces the total ESL of the structure 1. In particular, when the two in-hole electrodes 35A and 35B are provided in the single through-hole 31B formed near the center of the interposer 3, they produce magnetic fields of opposite polarities (opposite rotations) with respect to the through-hole 31B. The magnetic fields cancel each other, and this pronouncedly reduces ESL.

For this reason, even when the wiring width of the side electrodes 34A and 34B is small, ESL of the structure 1 can be made low by providing the in-hole electrodes 35A and 35B. This can reduce the amount of solder 200 that wets and spreads from the side electrodes 34A and 34B to the upper surface of the interposer 3.

Substrate end surfaces of the interposer 3 are spaced apart from component end surfaces of the capacitor 2, the grooves 31A are located under the bottom surface of the capacitor 2, and the side electrodes 34A and 34B are provided only on the side walls of the grooves 31A. Hence, the solder 200 is unlikely to wet and spread from the side electrodes 34A and 34B onto the upper surface of the interposer 3 across the bottom surface of the capacitor 2. Therefore, even if the amount of supplied solder paste is large to some extent, the solder 200 is unlikely to wet and spread onto the outer electrodes 22A and 22B on both end surfaces of the capacitor 2, and this can reduce the amount of solder 200 that reaches the outer electrodes 22A and 22B. For example, when the amount of solder is similar to that adopted when the capacitor 2 is directly mounted on the mounting lands 101A and 101B, a height Hth from the bottom surface of solder 200 that wets and spreads to the outer electrodes 22A and 22B can preferably be reduced to up to about one fourth to about one third.

For this reason, the capacitor 2 is not directly joined to the circuit board 100 with the solder 200, but is substantially indirectly joined to the circuit board 100 with the interposer 3 being disposed therebetween. Thus, distortion of the capacitor 2 resulting from the application of voltage from the mounting lands 101A and 101B is not directly transmitted to the circuit board 100 via the solder 200. This preferably greatly reduces audible sound produced from the circuit board 100.

After the structure 1 is mounted on the circuit board 100, flux residues sometimes remain around the solder 200. Since the flux residues corrode the peripheral electrodes and cause rust or the like, they are preferably removed by cleaning after mounting. In this structure, the through-hole 31B opens to spaces opposed to both principal surfaces of the interposer 3, and allows air to flow between the spaces. Hence, cleaning liquid and air are easily released to upper and lower sides of the interposer 3 through the through-hole 31B, and a portion between the capacitor 2 and the interposer 3 can be cleaned effectively.

Next, an ESL reduction effect obtained by providing the in-hole electrodes will be described on the basis of examples of finite element analysis of schematic structures.

Figure 5A:
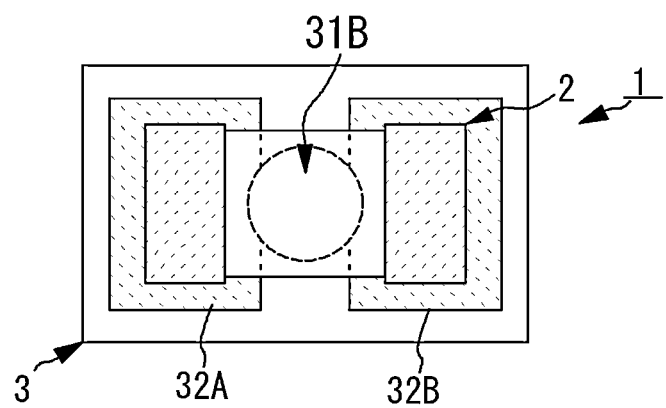
FIGS. 5A and 5B illustrate examples of finite element analysis of the chip-component structure according to a preferred embodiment of the present invention.

FIG. 5A illustrates a first schematic structure used in finite element analysis according to a preferred embodiment of the present invention. In this structure, grooves 31A and side electrodes 34A and 34B are omitted, and alternating-current voltage is applied to component mounting electrodes 32A and 32B via in-hole electrodes 35A and 35B (not illustrated) provided in a through-hole 31B.

Figure 5B:
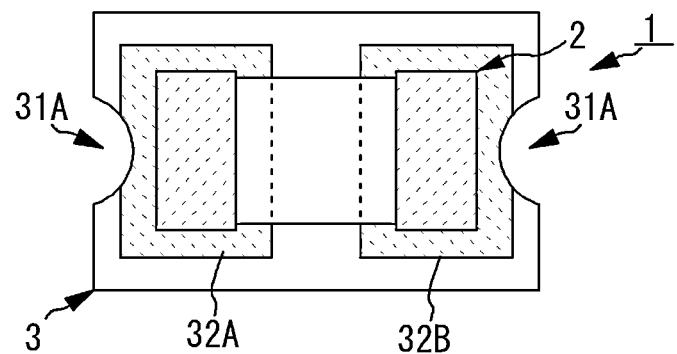

FIG. 5B illustrates a second schematic structure used in finite element analysis according to a preferred embodiment of the present invention. In this structure, a through-hole 31B and in-hole electrodes 35A and 35B are preferably omitted, and alternating-current voltage is applied to component mounting electrodes 32A and 32B via side electrodes 34A and 34B (not illustrated) provided in grooves 31A.

In finite element analysis using these structures, an interposer 3 preferably having a size of about 2.2×about 1.4×about 0.1 mm, for example, was set on pair lines of a circuit board, and alternating-current voltage was applied from the pair lines in a state in which a capacitor 2 preferably having a size of about 1.6×about 0.8×about 0.8 mm, for example, and an electrostatic capacity of about 10 μF was mounted on the interposer 3.

Figure 6A:
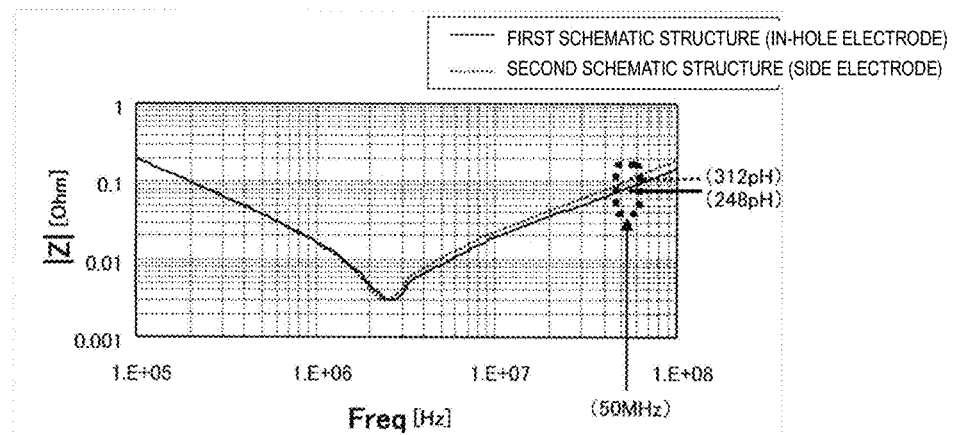
FIGS. 6A to 6C illustrate an ESL reduction effect on the basis of the examples of finite element analysis in accordance with preferred embodiments of the present invention.
Figure 6B:
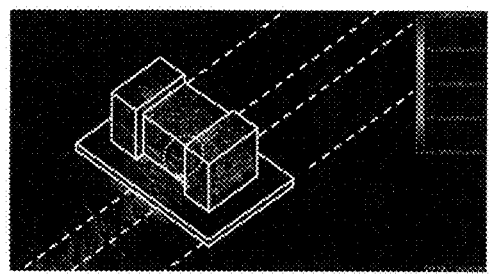
Figure 6C:
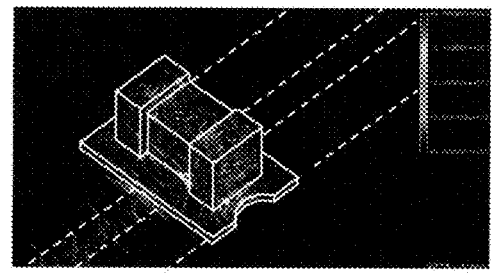

FIGS. 6B and 6C illustrate magnetic field distributions at a frequency of 100 MHz, respectively, in the first and second schematic structures.

According to the finite element analysis, it was confirmed that the magnetic field distribution in the interposer was smaller in the first schematic structure than in the second schematic structure, and that ESL was reduced in the first schematic structure in which only the in-hole electrodes were provided. This is considered to be because, in the first schematic structure in which two in-hole electrodes are provided in the single through hole, magnetic fields of opposite polarities (opposite rotations) produced centered on the in-hole electrodes cancel each other.

Further, S (scattering) parameters were analyzed for the structures, and frequency to impedance characteristics of the structures were determined from the S parameters.

FIG. 6A shows frequency to impedance characteristics of the structures obtained by analysis. In the first schematic structure, the frequency (resonant frequency) at which the impedance is the lowest is lower than in the second schematic structure. For this reason, an impedance lower than in the second schematic structure was obtained in a frequency band higher than the resonant frequency, and an impedance higher than in the second schematic structure was obtained in a frequency band lower than the resonant frequency. For example, at a frequency of about 50 MHz higher than the resonant frequency, the inductance of the first schematic structure was about 248 pH, which was smaller by about 20% than an inductance of about 312 pH of the second schematic structure. By this impedance analysis, it was also confirmed that ESL was reduced in the first schematic structure in which only the in-hole electrodes are provided.

While the ESL reduction effect can be obtained by the structure in which only the in-hole electrodes are provided without the side electrodes, as described above, in the structure in which the side electrodes and the in-hole electrodes are both provided in the interposer, ESL is more reliably reduced than the structure in which only the in-hole electrodes are provided, because current paths are dispersed. This shows that the structure of the first preferred embodiment of the present invention in which the side electrodes and the in-hole electrodes are both provided in the interposer can greatly reduce ESL.

Second Preferred Embodiment

Figure 7A:
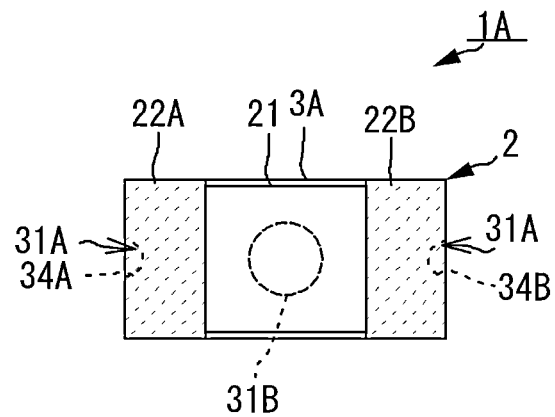
FIGS. 7A to 7C illustrate a structure of a chip-component structure according to a second preferred embodiment of the present invention.
Figure 7B:
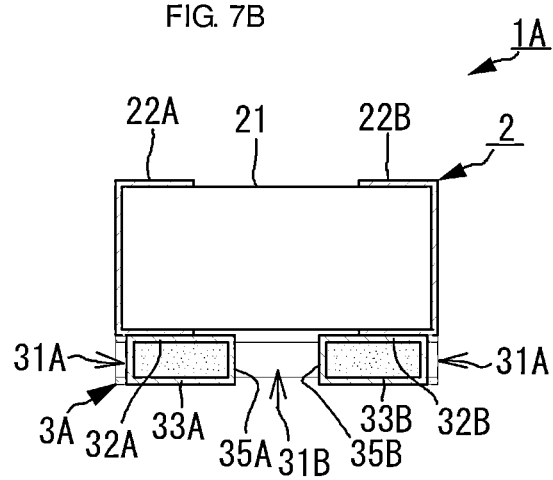
Figure 7C:
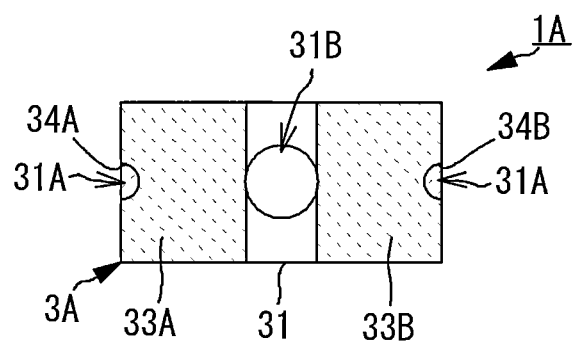

FIGS. 7A, 7B, and 7C are a plan view, a sectional front view, and a bottom view, respectively, of a chip-component structure 1A according to a second preferred embodiment of the present invention.

The chip-component structure 1A of the second preferred embodiment is preferably the same or substantially the same in the structure of a multilayer capacitor 2 as the chip-component structure 1 of the first preferred embodiment, but is different in that an interposer 3A having a different size is provided. For this reason, in the following description, structures corresponding to the structures adopted in the first preferred embodiment are denoted by the same reference numerals.

The outer shape of the interposer 3A in plan view is preferably identical or substantially identical to that of the multilayer capacitor 2. For this reason, arcs of grooves 31A provided in both longitudinal end surfaces of a substrate body 31 are entirely located under bottom surfaces of outer electrodes 22A and 22B of the capacitor 2.

In this structure, solder that wets and spreads upward on side electrodes 34A and 34B is also prevented by a bottom surface of the capacitor 2 from further spreading onto an upper surface of the interposer 3A. This reduces the amount of solder that reaches the outer electrodes 22A and 22B, and provides a vibration-noise suppressing effect.

Further, since the area of the interposer 3A is preferably equal or substantially equal to that of the multilayer capacitor 2 in plan view, even when the interposer 3A is used, the mounting area does not increase. Therefore, the structure 1A can be mounted in the minimum necessary mounting area.

Third Preferred Embodiment

Figure 8A:
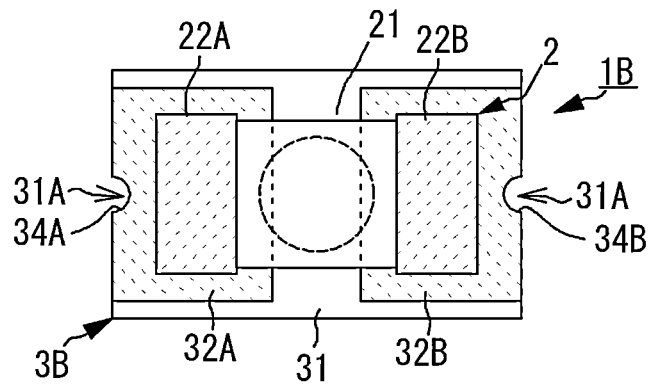
FIGS. 8A to 8C illustrate a structure of a chip-component structure according to a third preferred embodiment of the present invention.
Figure 8B:
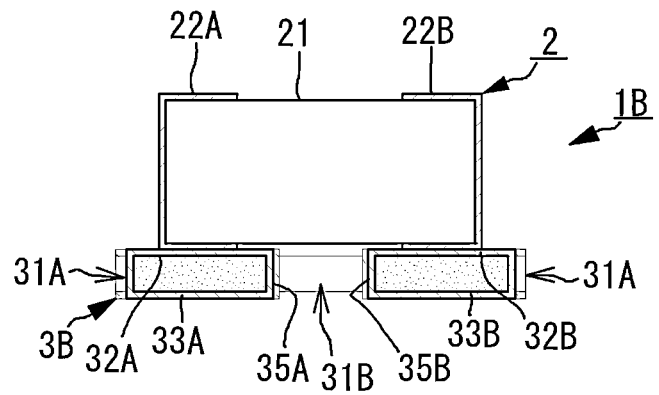
Figure 8C:
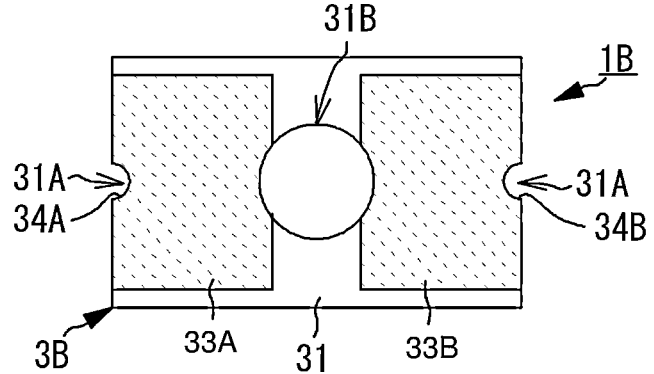

FIGS. 8A, 8B, and 8C are a plan view, a sectional front view, and a bottom view, respectively, of a chip-component structure 1B according to a third preferred embodiment of the present invention.

The chip-component structure 1B of the third preferred embodiment is preferably the same in the structure of a multilayer capacitor 2 as the chip-component structure 1 of the first preferred embodiment, but is different in that an interposer 3B having a different size is preferably included. For this reason, in the following description, structures corresponding to the structures adopted in the first preferred embodiment are denoted by the same reference numerals.

The interposer 3B preferably has an area wider than that of the interposer 3 of the first preferred embodiment. Grooves 31A provided in both longitudinal end surfaces of a substrate body 31 preferably do not overlap with outer electrodes 22A and 22B of the capacitor 2, as viewed in a principal-surface normal direction, and arcs thereof are preferably exposed entirely.

In this structure, since substrate end surfaces of the interposer 3B are spaced apart from component end surfaces of the capacitor 2, solder is restricted from spreading and reaching the outer electrodes 22A and 22B. This provides a vibration-noise reducing effect.

The shape of external connection electrodes 33A and 33B in this structure may be appropriately set according to the shape of mounting lands on a circuit board. Further, the grooves 31A can be omitted if so desired. In this case, side electrodes 34A and 34B are appropriately arranged on the substrate end surfaces.

Fourth Preferred Embodiment

Figure 9A:
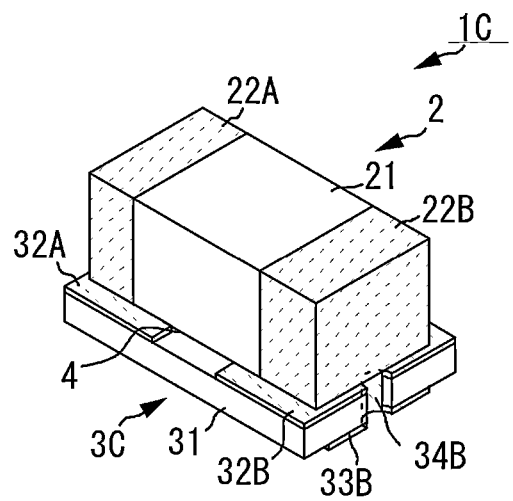
FIGS. 9A to 9C illustrate a structure of a chip-component structure according to a fourth preferred embodiment of the present invention.
Figure 9B:
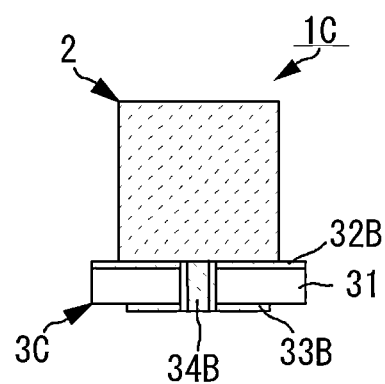
Figure 9C:
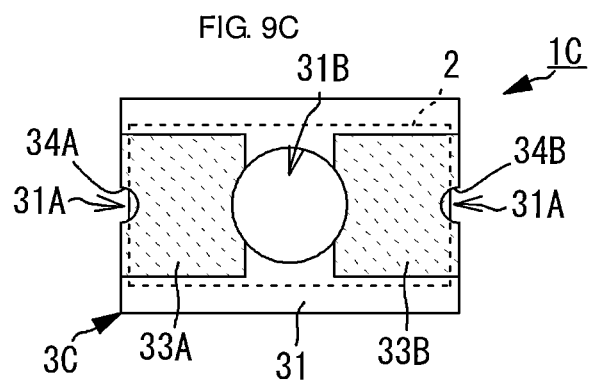

FIGS. 9A, 9B, and 9C are a perspective view, a right side view, and a bottom view, respectively, of a chip-component structure 1C according to a fourth preferred embodiment of the present invention.

The chip-component structure 1C of the fourth preferred embodiment is preferably the same or substantially the same in the structure of a multilayer capacitor 2 as the chip-component structure 1 of the first preferred embodiment, but is different in that an interposer 3C having a different shape is preferably included. For this reason, in the following description, structures corresponding to the structures adopted in the first preferred embodiment are denoted by the same reference numerals.

Substrate end surfaces of the interposer 3C in the longitudinal direction are aligned with substrate end surfaces of the capacitor 2, and substrate end surfaces of the interposer 3C in the lateral direction protrude outward from substrate end surfaces of the capacitor 2. In this structure, a vibration-noise reduction effect similar to that described above can also be obtained. That is, since grooves 31A are provided under the capacitor 2, solder that wets and spreads on side electrodes 34A and 34B in the grooves 31A rarely wets and spreads from the grooves 31A in an area outside the outer shape of the capacitor 2. This effectively reduces the height of solder that wets and spreads on outer electrodes 22A and 22B of the capacitor 2.

Fifth Preferred Embodiment

Figure 10A:
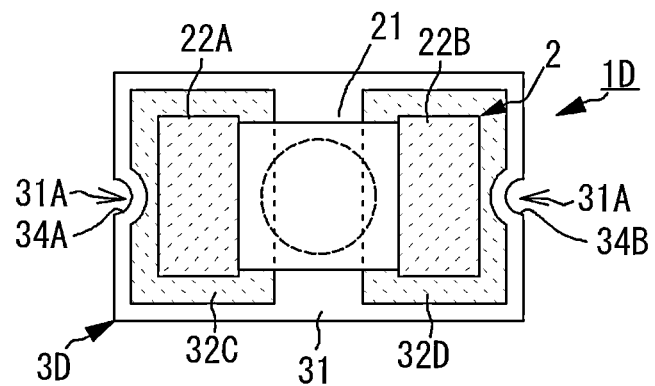
FIGS. 10A to 10C illustrate a structure of a chip-component structure according to a fifth preferred embodiment of the present invention.
Figure 10B:
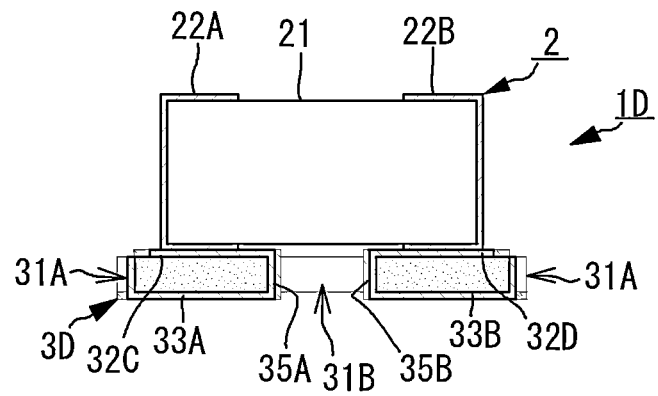
Figure 10C:
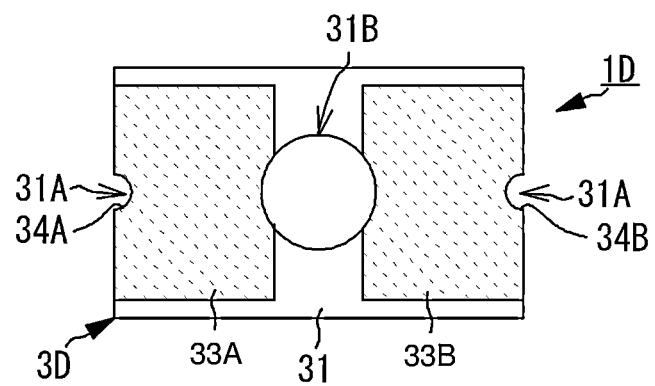

FIGS. 10A, 10B, and 10C are a plan view, a sectional front view, and a bottom view, respectively, of a chip-component structure 1D according to a fifth preferred embodiment of the present invention.

The chip-component structure 1D of the fifth preferred embodiment is preferably the same or substantially the same in the structure of a multilayer capacitor 2 as the chip-component structure 1B of the third preferred embodiment, but is different in that an interposer 3D having component mounting electrodes of a different shape is preferably included. For this reason, in the following description, structures corresponding to the structures adopted in the third preferred embodiment are denoted by the same reference numerals.

The interposer 3D preferably includes component mounting electrodes 32C and 32D whose electrode end portions are spaced apart from side electrodes 34A and 34B. For this reason, the side electrodes 34A and 34B are directly connected only to external connection electrodes 33A and 33B, respectively, and the external connection electrodes 33A and 33B and the component mounting electrodes 32C and 32D are electrically connected only by in-hole electrodes 35A and 35B, respectively.

In this structure, even when solder wets and spreads upward on the side electrodes 34A and 34B, it is unlikely to reach the outer electrodes 22A and 22B of the multilayer capacitor 2, and this effectively reduces or prevents production of audible sound in a circuit board. Although solder wets and spreads upward on the in-hole electrodes 35A and 35B, the amount of spreading solder is preferably sufficiently reduced because the solder is prevented from flowing onto side surfaces of the multilayer capacitor 2 by a bottom surface of the multilayer capacitor 2. Thus, distortion of the multilayer capacitor 2 is prevented from being transmitted to the circuit board by the solder spreading on the in-hole electrodes 35A and 35B.

Sixth Preferred Embodiment

Figure 11A:
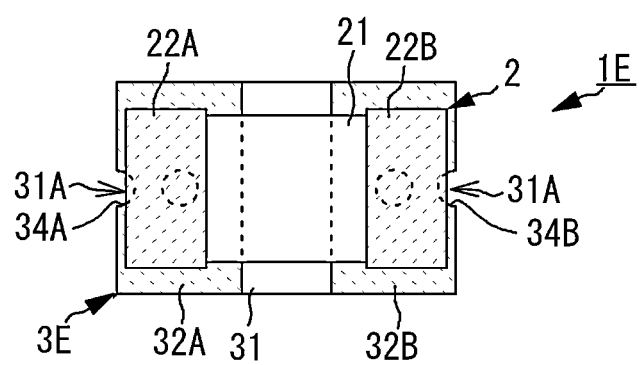
FIGS. 11A and 11B illustrate a structure of a chip-component structure according to a sixth preferred embodiment of the present invention.
Figure 11B:
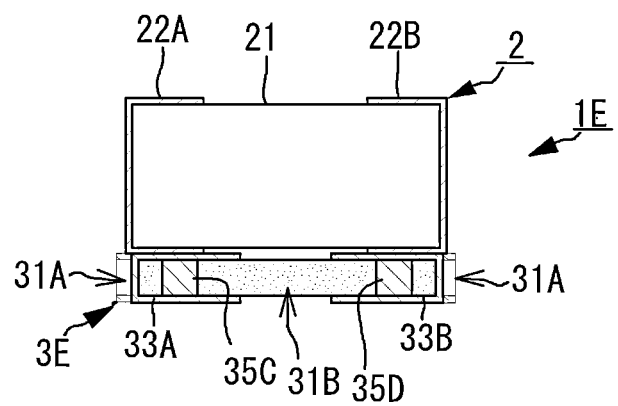

FIGS. 11A and 11B are a plan view and a sectional front view, respectively, of a chip-component structure 1E according to a sixth preferred embodiment of the present invention.

The chip-component structure 1E of the sixth preferred embodiment is preferably the same in the structure of a multilayer capacitor 2 as the chip-component structure 1 of the first preferred embodiment, but is different in that an interposer 3E having through-holes of a different shape is preferably included. For this reason, in the following description, structures corresponding to the structures adopted in the first preferred embodiment are denoted by the same reference numerals.

A substrate body 31 of the interposer 3E preferably includes in-hole electrodes 35C and 35D defined by through-holes filled with an electrode material. The in-hole electrodes 35C and 35D are preferably provided at approximate centers of component mounting electrodes 32A and 32B, respectively. In this structure, an ESL reduction effect can also be obtained. The number of in-hole electrodes 35C and 35D may be further increased, or an in-hole electrode having a structure similar to that adopted in the first preferred embodiment may be added. In any case, by forming the in-hole electrodes, audible sound produced in a circuit board can be effectively reduced or prevented while significantly reducing ESL.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A chip-component structure, comprising:
a multilayer capacitor including a laminated body including a plurality of dielectric layers and a plurality of internal electrodes stacked on each other, and first and second outer electrodes provided on opposite longitudinal component end surfaces of the laminated body and electrically connected to respective ones of the plurality of internal electrodes; and
an interposer including a substrate including a component mount surface, a substrate mount surface opposed to the component mount surface, a through-hole extending between and open to the component mount surface and the substrate mount surface, a component connecting electrode provided on the component mount surface and joined to one of the first and second outer electrodes, an external connection electrode provided on the substrate mount surface, and an in-hole electrode provided in the through-hole to connect the component connecting electrode and the external connection electrode and electrically connected to the one of the first and second outer electrodes; wherein
a periphery of the through-hole is in contact with the component connecting electrode when viewed in a direction perpendicular to the substrate mount surface; and
the through-hole includes a space which is not filled with the in-hole electrode.

2. The chip-component structure according to claim 1, wherein the through-hole includes a portion overlapping the laminated body and located between the first and second outer electrodes when viewed in the direction perpendicular to the substrate mount surface.

3. The chip-component structure according to claim 1, wherein the space of the through-hole is open to the substrate mount surface.

4. The chip-component structure according to claim 3, wherein the space of the through-hole is open to the component mount surface.

5. The chip component structure according to claim 1, wherein the in-hole electrode includes a portion overlapping the laminated body and located between the first and second outer electrodes when viewed in the direction perpendicular to the substrate mount surface.

6. The chip-component structure according to claim 1, wherein the component connecting electrode is spaced apart from a side surface of the substrate that intersects with the component mount surface and the substrate mount surface.

7. A chip-component structure, comprising:
a multilayer capacitor including a laminated body including a plurality of dielectric layers and a plurality of internal electrodes stacked on each other, and first and second outer electrodes provided on opposite longitudinal component end surfaces of the laminated body and electrically connected to respective ones of the plurality of internal electrodes; and
an interposer including a substrate including a component mount surface, a substrate mount surface opposed to the component mount surface, a through-hole extending between and open to the component mount surface and the substrate mount surface, a component connecting electrode provided on the component mount surface and joined to one of the first and second outer electrodes, an external connection electrode provided on the substrate mount surface, and an in-hole electrode provided in the through-hole to connect the component connecting electrode and the external connection electrode and electrically connected to the one of the first and second outer electrodes; wherein
the through-hole includes a portion overlapping the laminated body and located between the first and second outer electrodes when viewed in a direction perpendicular to the substrate mount surface; and the through-hole includes a space which is not filled with the in-hole electrode.

8. The chip-component structure according to claim 7, wherein the space of the through-hole is open to the substrate mount surface.

9. The chip-component structure according to claim 8, wherein the space of the through-hole is open to the component mount surface.

10. The chip component structure according to claim 7, wherein the in-hole electrode includes a portion overlapping the laminated body and located between the first and second outer electrodes when viewed in the direction perpendicular to the substrate mount surface.

11. The chip-component structure according to claim 7, wherein the component connecting electrode is spaced apart from a side surface of the substrate that intersects with the component mount surface and the substrate mount surface.

12. The chip-component structure according to claim 11, wherein
the side surface of the substrate is perpendicular or substantially perpendicular to a longitudinal direction connecting the opposite longitudinal component end surfaces of the laminated body; and
the interposer is larger than the multilayer capacitor in the longitudinal direction.

13. A chip-component structure, comprising:
a multilayer capacitor including a laminated body including a plurality of dielectric layers and a plurality of internal electrodes stacked on each other, and first and second outer electrodes provided on opposite longitudinal component end surfaces of the laminated body and electrically connected to respective ones of the plurality of internal electrodes; and
an interposer including a substrate including a component mount surface, a substrate mount surface opposed to the component mount surface, a through-hole extending between and open to the component mount surface and the substrate mount surface, a component connecting electrode provided on the component mount surface and joined to one of the first and second outer electrodes, an external connection electrode provided on the substrate mount surface, and an in-hole electrode provided in the through-hole to connect the component connecting electrode and the external connection electrode and electrically connected to the one of the first and second outer electrodes; wherein
the in-hole electrode includes a portion overlapping the laminated body and located between the first and second outer electrodes when viewed in a direction perpendicular to the substrate mount surface; and
the through-hole includes a space which is not filled with the in-hole electrode.

14. The chip-component structure according to claim 13, wherein the space of the through-hole is open to the substrate mount surface.

15. The chip-component structure according to claim 14, wherein the space of the through-hole is open to the component mount surface.

16. The chip-component structure according to claim 15, wherein the component connecting electrode is spaced apart from a side surface of the substrate that intersects with the component mount surface and the substrate mount surface.

17. The chip-component structure according to claim 16, wherein
the side surface of the substrate is perpendicular or substantially perpendicular to a longitudinal direction connecting the opposite longitudinal component end surfaces of the laminated body; and
the interposer is larger than the multilayer capacitor in the longitudinal direction.

* * * * *